United States Patent [19]
Thorpe et al.

[11] 4,307,349
[45] Dec. 22, 1981

[54] IMPATT AMPLIFIERS

[75] Inventors: William Thorpe, Felixstowe; Peter W. Huish, Stowmarket, both of England

[73] Assignee: The Post Office, London, England

[21] Appl. No.: 83,227

[22] Filed: Oct. 10, 1979

[30] Foreign Application Priority Data

Oct. 19, 1978 [GB] United Kingdom ............... 41209/78

[51] Int. Cl.³ ................................................ H03F 3/10
[52] U.S. Cl. ..................................... 330/287; 330/298
[58] Field of Search ...................... 330/207 P, 287, 298

[56] References Cited

U.S. PATENT DOCUMENTS 3,365,675  1/1968  Gaddy et al. .................... 330/298 X

OTHER PUBLICATIONS

Willing, "A Two-Stage Impatt Diode Amplifier", Telecommunication Journal, vol. 41-VII/1974, pp. 439-445.

Primary Examiner—James B. Mullins
Attorney, Agent, or Firm—Kemon & Estabrook

[57] ABSTRACT

A protection circuit for an Impatt amplifier includes a voltage comparator which is arranged to sense the terminal voltage of the or each Impatt diode. When the comparator senses that a diode terminal voltage has risen above a predetermined value a circuit is actuated which causes power to be disconnected from the amplifier. The present circuit does not require the use of expensive couplers.

4 Claims, 3 Drawing Figures

IMPATT AMPLIFIERS

DESCRIPTION

This invention relates to amplifiers which use Impatt diodes. Impatt diode amplifiers find application, for example, in microwave communications systems.

In order to obtain high output powers and high d.c. to r.f. conversion efficiencies Impatt diodes have been made with a non-uniform doping profile in which the doping density in the avalanche region is made greater than the doping density in the drift region of the diode. Depending on the detailed doping profile such diodes are commonly referred to as hi-lo, lo-hi-lo or modified READ profile. The effect of such a profile, in addition to allowing high output powers to be obtained is to make the ratio of small signal to large signal negative resistance much higher than is observed with conventional uniformly doped diodes. As a result, Impatt diode amplifiers using these diodes are only conditionally stable, and tend to oscillate when little or no r.f. drive is present. This can be particularly troublesome in a multichannel radio system where such oscillations can cause severe interference to other working channels.

A known method of protecting an Impatt amplifier is to provide a directional coupler at the amplifier input to couple a small portion of the input signal to a detector. The coupled signal is amplified and applied to circuitry for removing the amplifier bias when failure occurs. To provide full protection using this method requires a coupler for each stage of the amplifier thus making it expensive.

The present invention provides a protection arrangement for an Impatt amplifier which relies for its operation on the fact that the d.c. terminal voltage of these Impatt diodes decreases quite strongly with increasing r.f. drive level. Any change in the radio frequency drive level will cause a change in the Impatt diode terminal voltage. By sensing this terminal voltage it is possible to provide an arrangement which will automatically disconnect power to the amplifier in the event that the drive level falls below a predetermined value.

According to the present invention there is provided an Impatt amplifier including at least one Impatt diode, means for sensing the terminal voltage of the Impatt diode, said sensing means, when it senses that the terminal voltage is greater than a predetermined value, being operative to actuate means for disconnecting power to the amplifier.

The sensing means may comprise a comparator, the comparator having two inputs one of which is connected to the Impatt diode terminal and the other of which is connected to a reference voltage source, and a transistor arranged to switch from a non-conductive to a conductive state when the comparator senses that the terminal voltage has risen above said predetermined value.

The means for disconnecting power may comprise a relay the coil of which is connected in series with said transistor, the coil being energised when said transistor becomes conductive thereby causing contacts in a power line of the amplifier to be opened.

When the amplifier has a plurality of stages each having an Impatt diode, a comparator may be provided for each stage, the output from each comparator being connected via an OR-gate to the switching transistor.

The invention will be described now by way of example only with particular reference to the accompanying drawings. In the drawings.

Figure 1:
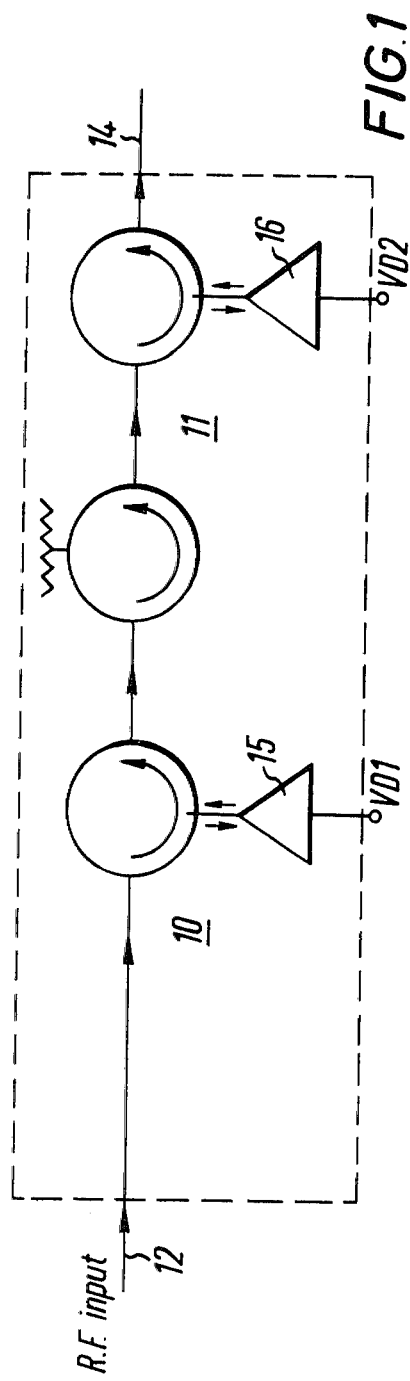
FIG. 1 is a schematic illustration of a two stage Impatt reflection amplifier.

The amplifier shown in FIG. 1 is a two stage Impatt reflection amplifier having a driver stage 10 with an Impatt diode 15 and an output stage 11 with an Impatt diode 16. The input to the amplifier is on line 12 and the output appears on line 14. If the input on line 12 should fail or reduce in amplitude, the Impatt diode terminal voltages indicated at VD1 and VD2 rise in value. The terminal voltages VD1 and VD2 can be monitored using a comparator and the comparator output used to disconnect power from the amplifier should the terminal voltage of either diode rise above a predetermined reference value. A power supply circuit incorporating such a comparator is shown in FIG. 2.

Figure 2:
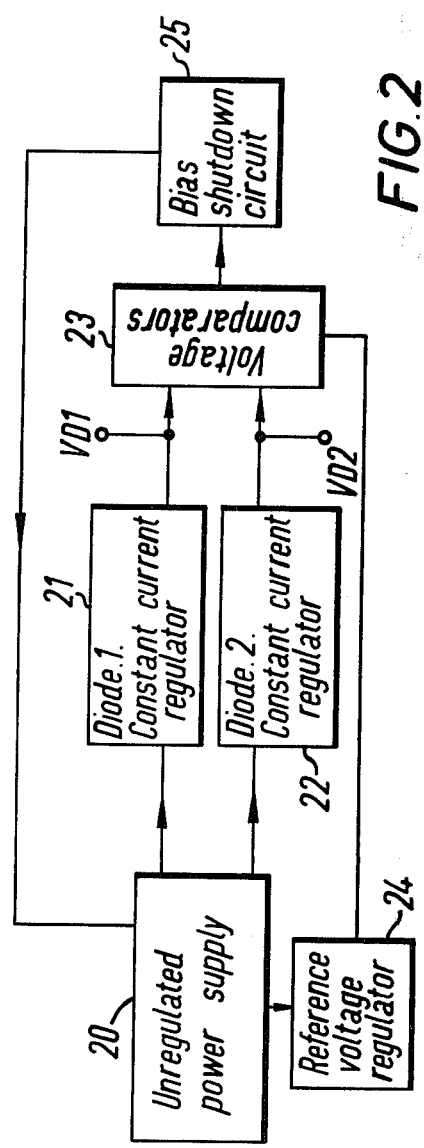
FIG. 2 is a block schematic diagram illustrating an amplifier in accordance with the present invention.

The circuit shown in FIG. 2 has a power supply 20 which is connected to first and second constant current regulators 21, 22. The regulators are arranged to supply regulated current to the Impatt diodes 15, 16. A pair of voltage comparators shown at 23 are connected such that one is arranged to receive as one input the terminal voltage VD1 and the other is arranged to receive the other terminal voltage VD2. Each voltage comparator also receives a reference input from a reference voltage regulator 24. The output from the voltage comparators is connected to a bias shut-down circuit 25 which in turn is connected to the power supply 20.

In operation if either of the terminal voltages VD1 or VD2 rises above a predetermined value determined by the reference voltage of the voltage regulator 24 then that comparator switches state to actuate the shut-down circuit 25 thereby removing power from the amplifier.

Figure 3:
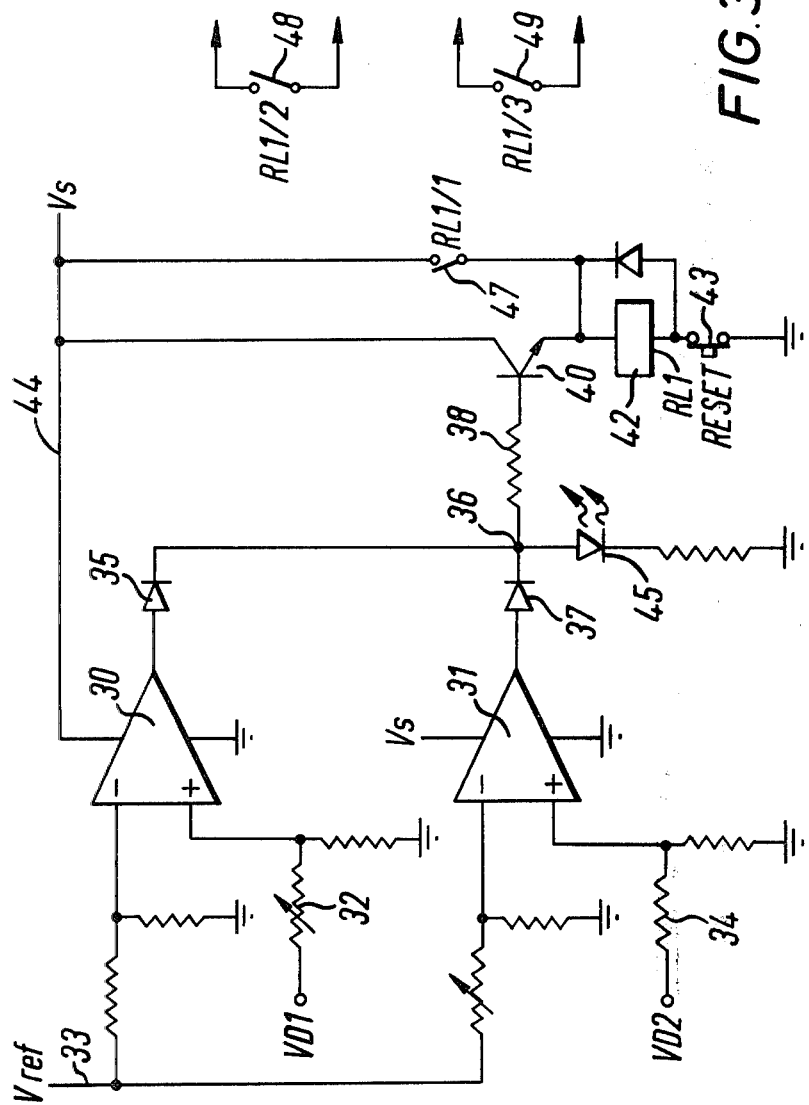
FIG. 3 is a circuit diagram of part of the amplifier shown in FIG. 2.

A circuit diagram showing the elements of the blocks 23 and 25 is given in FIG. 3. The circuit has two comparators 30, 31 each of which comprises a 741 operational amplifier. One input of each of the comparators is connected to the reference voltage regulator 24 by line 33. The second input of the comparator 30 is connected to receive the terminal voltage VD1 via a variable resistor 32 whilst the second input to the comparator 31 is connected to receive the terminal voltage VD2 via a resistor 34. The output of the comparator 30 is connected by a diode 35 to a junction 36 and the output of the comparator 31 is connected by a diode 37 to the junction 36. The junction 36 is connected by a resistor 38 to the base of a transistor 40. The collector-emitter circuit of the transistor 40 is connected in series with a relay coil 42 and a push button switch 43 between power line 44 and earth. A light emitting diode 45 is connected between the junction 36 and earth.

The relay has contacts 47, 48 and 49. When the relay coil is not energised the contacts 47 are open whilst the contacts 48 and 49 are closed. The contacts 48 and 49 are arranged in the power supply line of the Impatt amplifier.

In operation provided there is an input to each of the amplifier stages 10 and 11 shown in FIG. 1 the terminal voltages VD1 and VD2 remain below the reference signal on line 33 of FIG. 2. In this condition the output of each comparator 30 and 31 are both low and the transistor 40 is non-conductive. Thus the relay coil 42 is not energised and the contact 47 is open whilst the contacts 48 and 49 remain closed allowing power to be supplied to the amplifier. If for example the input to the stage 10 fails the terminal voltage VD1 rises above the reference input to the comparator 30. This causes the output of the comparator 30 to go high resulting in a high input appearing at the junction 36. The transistor 40 switches from a non-conductive to a conductive state thereby energising the relay coil 42. This causes the contacts 47 to close latching the relay coil to its energised state, and the contacts 48 and 49 are opened. When the contacts 48 and 49 open power is removed from the amplifier thus shutting the amplifier down. Once the relay has been energised it can only be reset to its non-energised state by operation of the reset button 43. Thus whenever a fault occurs power is removed from the Impatt amplifier until such time as it is restored by operation of the reset button 43. Removal of the power is indicated by the light emitting diode 45 which is energised whenever the junction 36 is high.

The above operation also applies to comparator 31 whenever the input to the stage 11 disappears for some reason.

The operational amplifiers 30 and 31 are operated in their open loop gain mode to ensure that their outputs switch into saturation when the voltage input from the respective Impatt diode exceeds the reference voltage. Separate comparators are used for each monitored stage to ensure good isolation between the diode voltages.

The present arrangement has two distinct advantages over prior art arrangements. Firstly it is less expensive because it does not require couplers or detectors. Secondly no losses occur in the radio frequency path because the detection method is isolated from the signal path.

We claim:

1. An Impatt amplifier including at least one modified READ profile Impatt diode; means affording connection of said amplifier to a source of power; and sensing means connected to sense the terminal voltage of said diode and operative when the terminal voltage exceeds a predetermined value for disconnecting said amplifier from the power source.

2. An Impatt amplifier as claimed in claim 1 wherein said sensing means comprises a comparator having two inputs one of which is connected to the input diode terminal and the other of which is connected to a reference voltage source, and a transistor arranged to switch from a non-conductive to a conductive state when the comparator senses that the terminal voltage has risen above the predetermined value.

3. An Impatt amplifier as claimed in claim 2 wherein the means for disconnecting power comprises a relay the coil of which is connected in series with said transistor, the coil being energised when said transistor becomes conductive thereby causing contacts in a power line of the amplifier to be opened.

4. An Impatt amplifier as claimed in claim 2 or claim 3 wherein said amplifier has a plurality of stages each with an Impatt diode and a comparator is provided for each stage, the output from each comparator being connected via an OR-gate to the switching transistor.

* * * * *